United States Patent
Tamura et al.

(10) Patent No.: US 7,649,232 B2
(45) Date of Patent: Jan. 19, 2010

(54) P-CHANNEL MOS TRANSISTOR, SEMICONDUCTOR INTEGRATED CIRCUIT DEVICE AND FABRICATION PROCESS THEREOF

(75) Inventors: Naoyoshi Tamura, Kawasaki (JP);
Kazuo Kawamura, Kawasaki (JP);
Akira Katakami, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 85 days.

(21) Appl. No.: 11/188,142

(22) Filed: Jul. 25, 2005

(65) Prior Publication Data

US 2006/0220113 A1 Oct. 5, 2006

(30) Foreign Application Priority Data

Mar. 29, 2005 (JP) ............................. 2005-096277

(51) Int. Cl.
*H01L 29/72* (2006.01)
(52) U.S. Cl. .................. 257/383; 257/288; 257/335; 257/368; 257/384; 257/401; 257/757
(58) Field of Classification Search ................ 257/288, 257/335, 368, 383, 384, 401, 757
See application file for complete search history.

(56) References Cited

U.S. PATENT DOCUMENTS

| | | | |
|---|---|---|---|
| 5,710,450 A | 1/1998 | Chau et al. | |
| 5,937,300 A | 8/1999 | Sekine et al. | |
| 5,965,942 A * | 10/1999 | Itoh et al. | 257/761 |
| 6,165,826 A | 12/2000 | Chau et al. | |
| 6,593,217 B1 | 7/2003 | Fujisawa | |
| 6,621,131 B2 | 9/2003 | Murthy et al. | |
| 2003/0040158 A1 * | 2/2003 | Saitoh | 438/279 |
| 2005/0082616 A1 * | 4/2005 | Chen et al. | 257/350 |
| 2006/0011988 A1 * | 1/2006 | Chen et al. | 257/369 |
| 2006/0011990 A1 * | 1/2006 | Furukawa et al. | 257/377 |

FOREIGN PATENT DOCUMENTS

| | | |
|---|---|---|
| JP | 05-283685 A | 10/1993 |
| JP | 07-106569 A | 4/1995 |
| JP | 08-167717 A | 6/1996 |
| JP | 2001-250791 A | 9/2001 |
| JP | 2002-530864 | 9/2002 |
| WO | WO 00/30169 | 5/2000 |

OTHER PUBLICATIONS

T. Ghani et al.; "A 90nm High Volume Manufacturing Logic Technology Featuring Novel 45nm Gate Length Strained Silicon CMOS Transistors", IEEE, 2003.
M. D. Giles et al.; "Understanding Stress Enhanced Performance in Intel 90nm CMOS Technology", 2004 Symposium on VLSI Technology Digest of Technical Paper, IEEE, pp. 118-119.
S. E. Thompson et al.; "Key Differences For Process-induced Uniaxial vs. Substrate-induced Biaxial Stressed Si and Ge Channel MOSFETs", 2004 IEEE.
S. E. Thompson et al.; "A 90-nm Logic Technology Featuring Strained-Silicon", IEEE Transactions on Electron Devices, vol. 51, No. 11, Nov. 2004, pp. 1790-1797.
Japanese Office Action issued on Sep. 9, 2008 for corresponding Japanese Patent Application No. 2005-096277.
Japanese Office Action dated Apr. 21, 2009; issued in corresponding Japanese Application No. 2005-096277.

* cited by examiner

*Primary Examiner*—Edward Wojciechowicz
(74) *Attorney, Agent, or Firm*—Westerman, Hattori, Daniels & Adrian, LLP

(57) ABSTRACT

A p-channel MOS transistor includes source and drain regions of p-type formed in a silicon substrate at respective lateral sides of a gate electrode wherein each of the source and drain regions of p-type includes any of a metal film region and a metal compound film region as a compressive stress source accumulating therein a compressive stress.

13 Claims, 16 Drawing Sheets

FIG.4
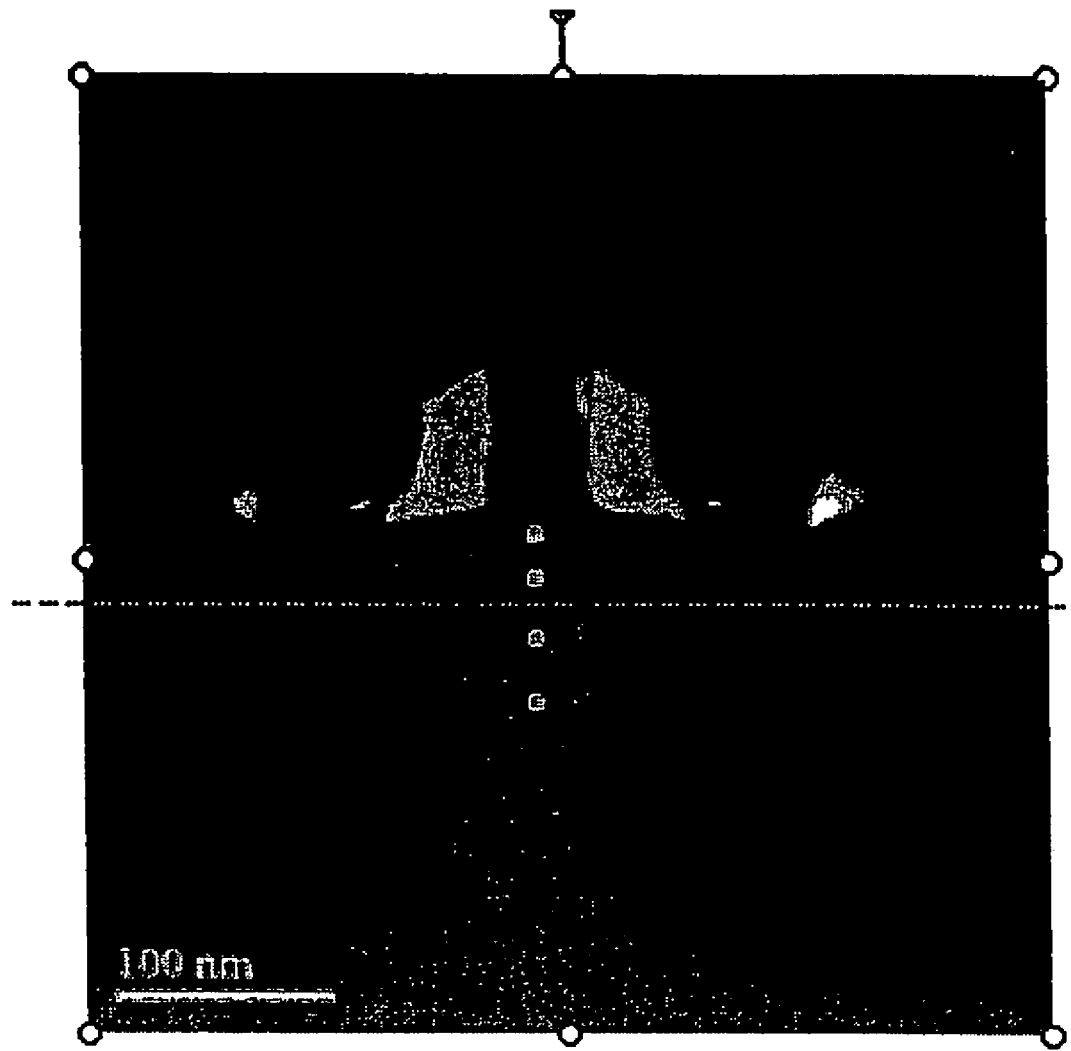
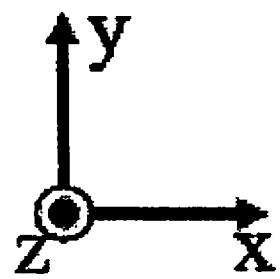
STRESS
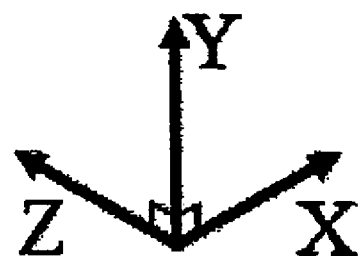
STRAIN

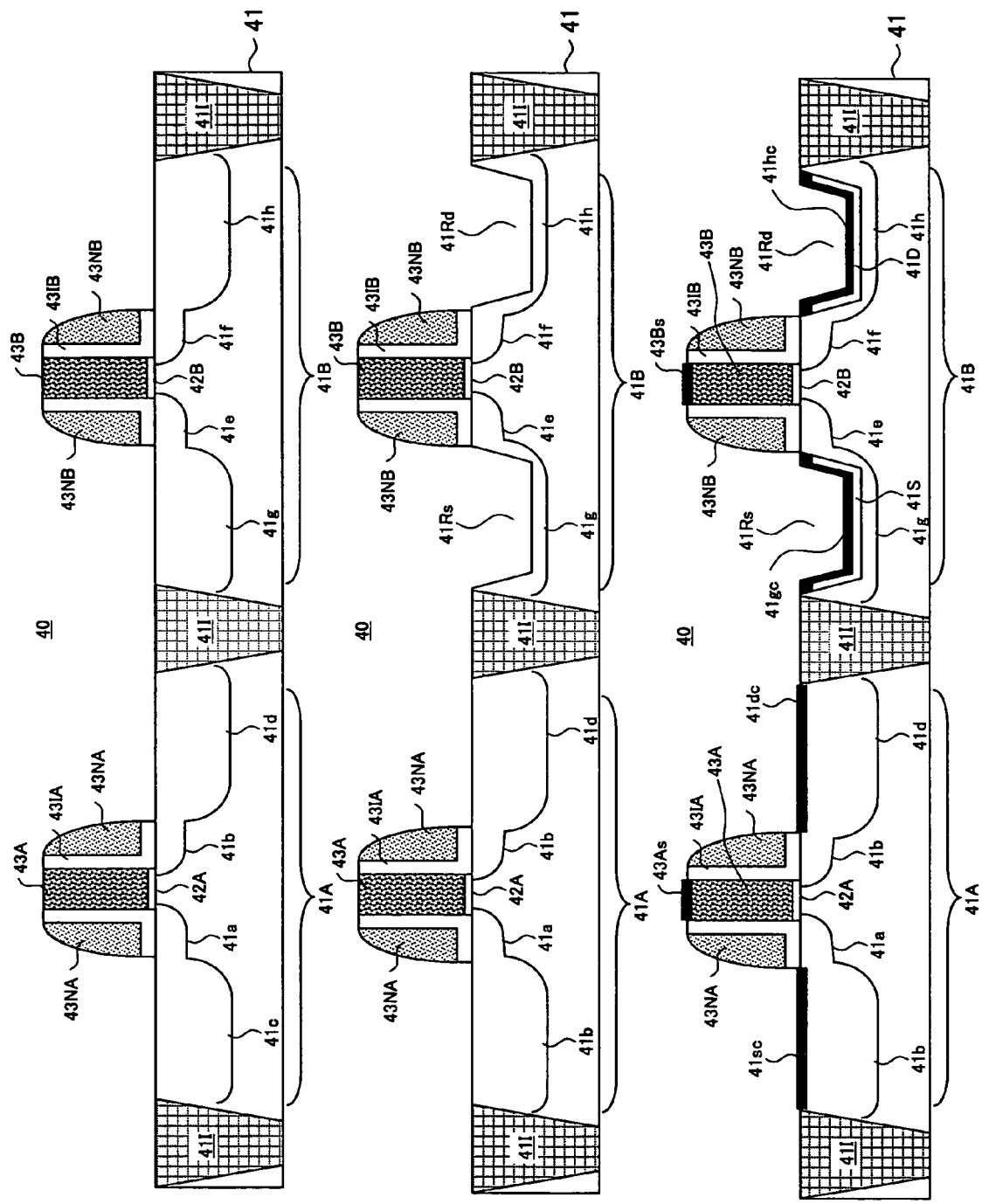

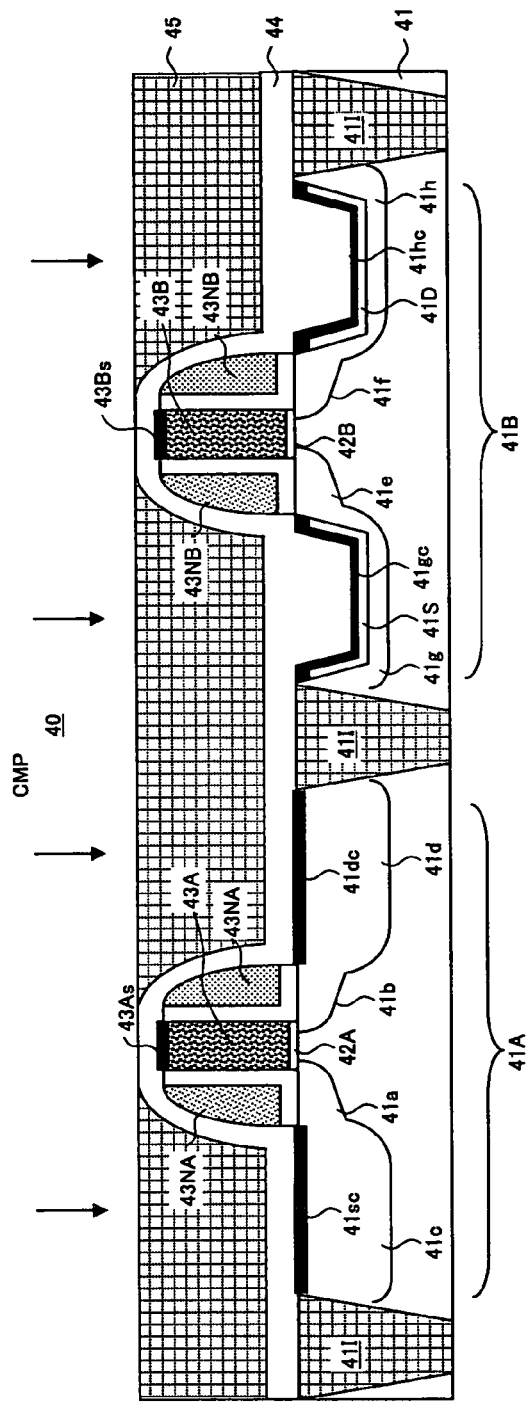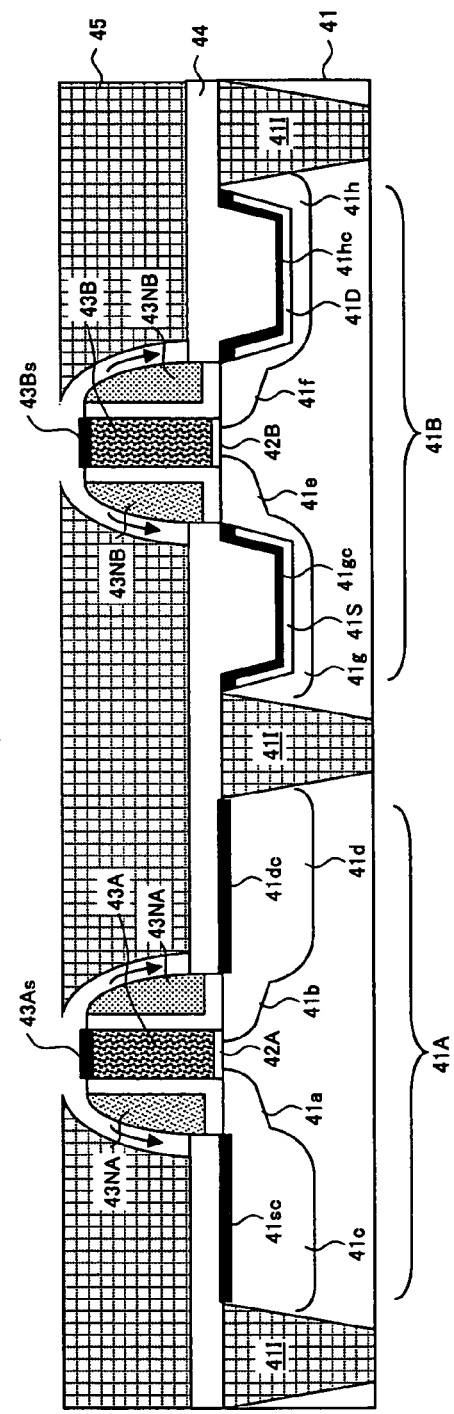
FIG.7F
FIG.7G

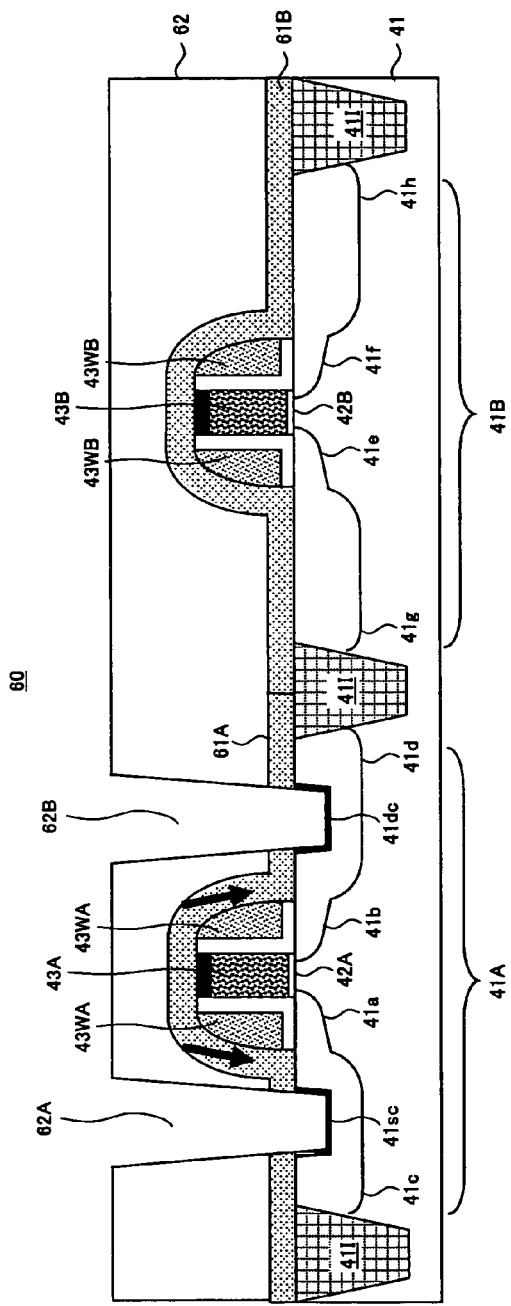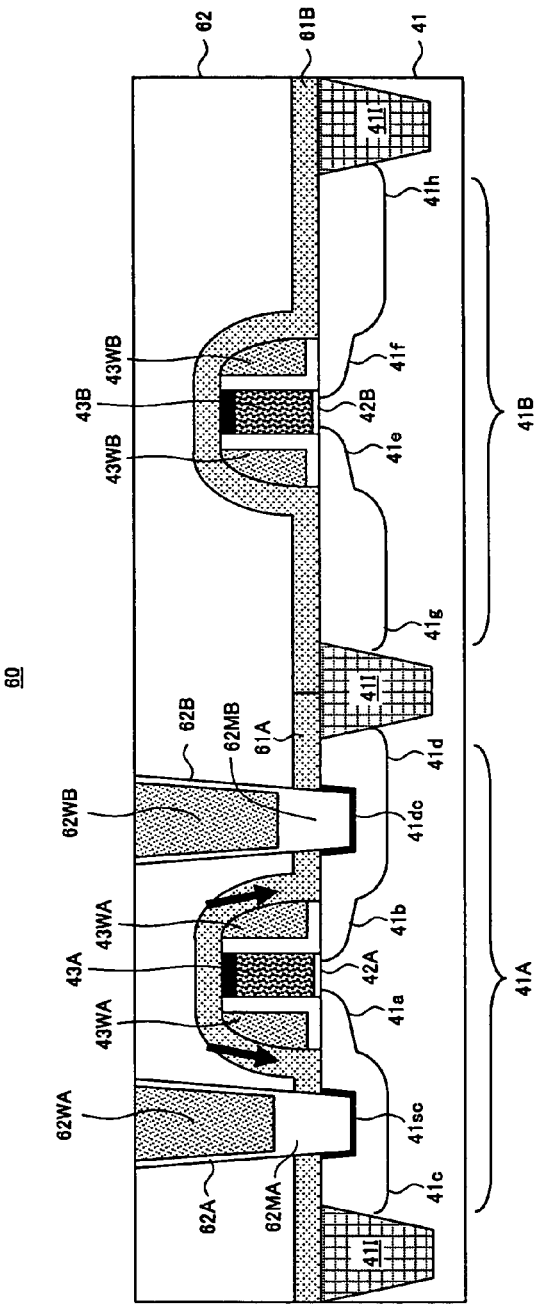
FIG.10A
FIG.10B

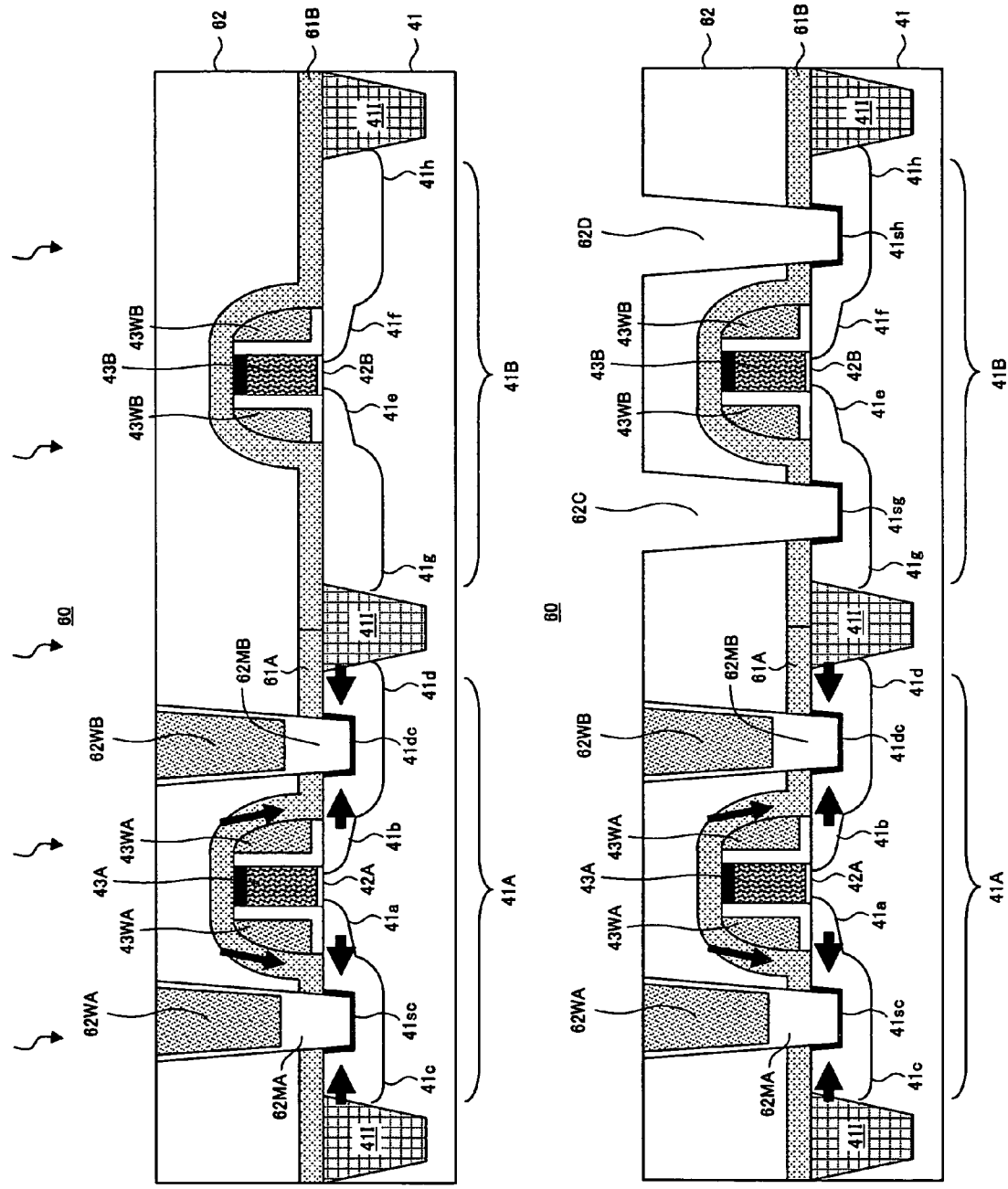

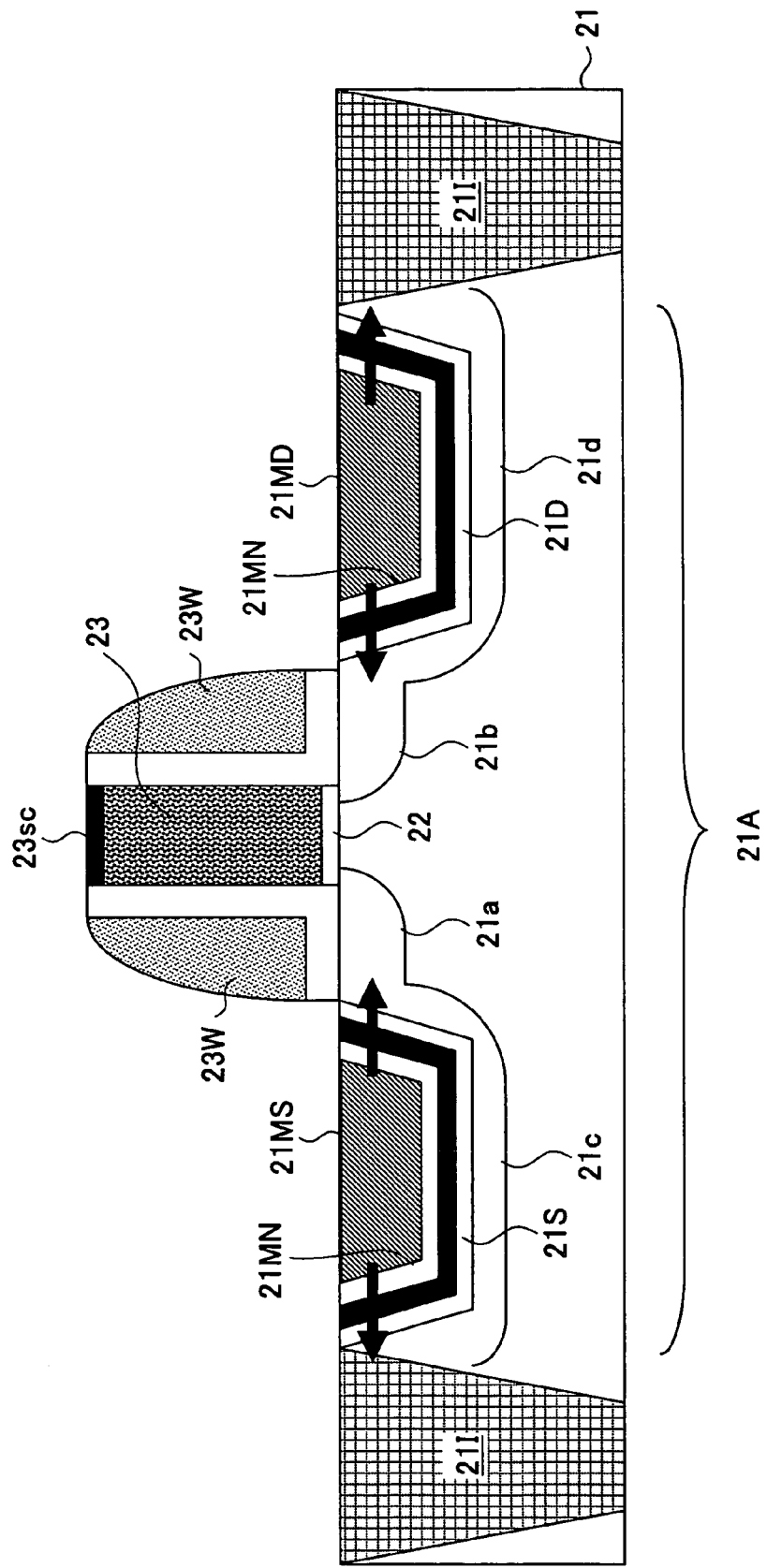

P-CHANNEL MOS TRANSISTOR, SEMICONDUCTOR INTEGRATED CIRCUIT DEVICE AND FABRICATION PROCESS THEREOF

CROSS-REFERENCE TO RELATED APPLICATION

The present application is based on Japanese priority application No. 2005-096277 filed on Mar. 29, 2005, the entire contents of which are hereby incorporated by reference.

BACKGROUND OF THE INVENTION

The present invention generally relates to semiconductor devices and more particularly to a semiconductor integrated circuit device including a stressed semiconductor device that achieves improved operational speed as a result of stressing and fabrication process thereof.

With progress in the technology of device miniaturization, it is now becoming possible to produce ultrafine and ultra high-speed semiconductor devices having a gate length of 100 nm or less.

With such ultrafine and ultrahigh speed transistors, the area of the channel region right underneath the gate electrode is very small as compared with conventional semiconductor devices, and thus, mobility of electrons or holes traveling through the channel region is influenced heavily by the stress applied to the channel region. Thereupon, various attempts have been made for improving the operational speed of the semiconductor device by optimizing the stress applied to the channel region.

REFERENCES

Patent Reference 1 Japanese Laid-Open Patent Application 2002-530864

Patent Reference 2 U.S. Pat. No. 6,165,826

Patent Reference 3 U.S. Pat. No. 5,710,450

Patent Reference 4 U.S. Pat. No. 6,621,131

Non-patent Reference 1 Ghani, T., et al., IEDM 2003, 978-980, Jun. 10, 2003

Non-patent Reference 2 Giles, M. D., et al., VLSI 2004

Non-patent Reference 3 Thompson, S. E., IEDM 2004

Non-patent Reference 4 Thompson, S. E., IEEE ED-51, vol. 10, 2004

SUMMARY OF THE INVENTION

Conventionally, in order to improve the operational speed of n-channel MOS transistors, there is a known construction of forming a stressor film, typically an SiN film accumulating therein a tensile stress, in the device region of an n-channel MOS transistor so as to include the gate electrode for improvement of electron mobility in the channel region right underneath the gate electrode.

FIG. 1 schematically shows the construction of an n-channel MOS transistor having such a stressor film.

Referring to FIG. 1, there is defined a device region 1A of an n-channel MOS transistor on a silicon substrate 1 by an STI structure 1I in the form of a p-type well, and a gate electrode 3 is formed on a part of the silicon substrate 1 corresponding to the device region 1A via a gate insulation film 2 in correspondence to a channel region formed therein. Further, source and drain extension regions 1a and 1b of n-type are formed in the silicon substrate 1 at respective lateral sides of the gate electrode 3.

Further, sidewall insulation films 3A and 3B, are formed on respective sidewall surfaces of the gate electrode 3, and source and drain diffusion regions 1c and 1d of $n^+$-type are formed in the silicon substrate 1 at respective outer sides of the sidewall insulation films 3A and 3B in overlapping relationship with the source and drain extension regions 1a and 1b, respectively.

Further, silicide layers 4A and 4B are formed on the respective surface parts of the source and drain diffusion regions 1c and 1d, and a silicide layer 4C is formed on the gate electrode 3.

Further, with the construction of FIG. 1, there is formed an SiN film 5 accumulating therein a tensile stress on the silicon substrate 1 so as to cover a gate structure, which includes: the gate electrode 3; the sidewall insulation films 3A and 3B; and further the silicide layer 4, wherein such a tensile stressor film 5 functions to urge the gate electrode 3 in the direction of the silicon substrate 1. As a result, a compressive stress is applied to the channel region of the n-channel MOS transistor right underneath the gate electrode 3 in a direction perpendicular to the substrate surface, and as a result, there is induced a strain in the channel region equivalent of the strain in which a tensile stress (in-plane tensile stress) is applied parallel to the substrate surface.

With such a construction, symmetry of the Si crystal constituting the channel region is modulated locally, and scattering of electrons taking place between crystallography equivalence states is suppressed. Thereby, electron mobility is improved in the channel region, and thus, the operational speed of the n-channel MOS transistor is improved.

On the other hand, it is known conventionally that the mobility of carriers is improved in a p-channel MOS transistor that uses holes for the carriers by applying a uniaxial compressive stress to the channel region, and the construction schematically shown in FIG. 2 is proposed as the means for applying the compressive stress to the channel region (Patent References 1-4, Non-patent References 1-4).

Referring to FIG. 2, three is formed a gate electrode 13 on the silicon substrate 11 in correspondence to the channel region via a gate insulation film 12, and p-type diffusion regions 11a and 11b are formed in the silicon substrate 11 at respective lateral sides of the gate electrode 13 so as to define the channel region therebetween. Further, sidewall insulation film 13A, 13B are formed on the respective sidewall surfaces of the gate electrode 13 so as to cover a part of the surface of the silicon substrate 11.

Here, the diffusion regions 11a and 11b function as the source and drain extension regions of the MOS transistor, and flow of the holes through the channel region right underneath the gate electrode 13 from the diffusion region 11a to the diffusion region 11b is controlled by a gate voltage applied to the gate electrode 13.

In the construction of FIG. 2, there are further formed SiGe mixed crystal layers 11A and 11B epitaxially to the silicon substrate 11 at respective outer sides of the sidewall insulation films 13A and 13B, and source and drain regions of p-type are formed in the SiGe mixed crystal layers 11A and 11B in continuation to the diffusion regions 11a and 11b.

With the p-channel MOS transistor of FIG. 2, the SiGe mixed crystal layers 11A and 11B have a lattice constant larger than that of the silicon substrate 11, and thus, there is induced a compressive stress shown with arrows a in the SiGe mixed crystal layers 11A and 11B. As a result, the SiGe mixed crystal layers 11A and 11B undergo straining in a generally perpendicular direction to the surface of the silicon substrate 11 as represented by an arrow b.

Because the SiGe mixed crystal layers 11A and 11B are formed epitaxially to the silicon substrate 11, the strain in the SiGe mixed crystal layers 11A and 11B represented with the arrow b induces a corresponding strain in the channel region of the silicon substrate 11 as represented by an arrow c, while such a strain induces shrinkage in the channel region in the channel direction. Thereby, there is induced a state equivalent to the case in which a uniaxial compressive stress is applied to the channel region as shown by an arrows d.

With the p-channel MOS transistor of FIG. 2, symmetry of the Si crystal constituting the channel region is modulated as a result of the deformation corresponding to such a uniaxial compressive stress of the channel region, and degeneration of light holes and heavy holes in the valence band is resolved with such change of crystal symmetry. Thereby, there occurs increase of hole mobility in the channel region and the operational speed of the transistor is improved. Such increase of hole mobility by the stress induced in the channel region and associated improvement of the transistor operational speed appear especially conspicuous with ultrafine semiconductor devices having a gate length of 100 nm or less.

However, with the conventional art shown in FIG. 2, the stressing of the channel region relies on the indirect mechanism that uses elongation of the SiGe mixed crystal layers 11A and 11B in the direction perpendicular to the substrate surface caused by difference of lattice constant between the SiGe mixed crystal layers and the silicon substrate 11, and it is not possible to achieve satisfactory improvement of device characteristics for the p-channel MOS transistor. In relation to this, it should be noted that, because the SiGe mixed crystal layers 11A and 11B maintain epitaxy to the silicon substrate 11, the atomic distance of the channel region in the channel direction is constrained by the atomic distance of the silicon substrate, and it is not possible for the SiGe mixed crystal layers 11A and 11B to cause dilatation in the channel direction even when there is induced a compressive stress as a result of difference of lattice constant. In other words, it is not possible with this technology of prior art to directly induce a compressive stress in the channel region of the p-channel MOS transistor so as to act in the channel direction.

Further, in order to induce a large compressive stress in the channel region of a p-channel MOS transistor such that the compressive stress acts in the channel direction with the mechanism of FIG. 2, it is desirable to form the SiGe mixed crystal layers 11A and 11B as close to the channel as possible and increase the depth of the SiGe mixed crystal layers 11A and 11B as large as possible, while this necessitates formation of a deep recess for the SiGe mixed crystal layers 11A and 11B while controlling the shape of the recess carefully and with good reproducibility. Further, with the conventional technology, it is necessary to fill such a deep recess with the SiGe mixed crystal layers 11A and 11B by conducting a selective epitaxial growth. For this, it is necessary to control the process such that the epitaxial growth of the SiGe mixed crystal layers 11A and 11B occurs only on the recessed surface and not on other parts such as the sidewall insulation films 13A and 13B.

Thus, various difficulties arise when attempt is made to implement the process of FIG. 2 in the actual mass production process.

According to a first aspect, the present invention provides a p-channel MOS transistor, comprising:

a silicon substrate including a channel region therein;

a gate electrode formed on said silicon substrate in correspondence to said channel region via a gate insulation film;

a source extension region of p-type and a drain extension region of p-type formed in said silicon substrate at respective sides of said channel region; and a source region of p-type and a drain region of p-type formed in said silicon substrate at respective lateral sides of said gate electrode at respective outer sides of sidewall insulation films formed on respective sidewall surfaces of said gate electrode in a partially overlapping relationship with said source extension region of p-type and said drain extension region of p-type respectively, each of said source region and drain region of p-type including therein any of a metal film region and a metal compound film region and enveloping a compressive stress source accumulating therein a compressive stress.

In another aspect, the present invention provides a semiconductor integrated circuit device comprising:

a silicon substrate defined with a first device region including a first channel region and a second device region including a second channel region by a device isolation region;

an n-channel MOS transistor formed on said first device region, comprising: a first gate electrode of n-type formed on said silicon substrate via a first gate insulation film in correspondence to a first channel region; a source extension region of n-type and a drain extension region of n-type formed in a part of said silicon substrate corresponding to said first device region at respective lateral sides of said first channel region; and a source region and a drain region of n-type formed in a part of said silicon substrate corresponding to said first device region at respective lateral sides of said first gate electrode at outer sides of sidewall insulation films formed on respective sidewall surfaces of said first gate electrode so as to overlap partially with said source extension region of n-type and said drain extension region of n-type respectively;

a p-channel MOS transistor formed on said second device region, comprising: a second gate electrode of p-type formed on said silicon substrate via a second gate insulation film in correspondence to a second channel region; a source extension region of p-type and a drain extension region of p-type formed in a part of said silicon substrate corresponding to said second device region at respective lateral sides of said second channel region; and a source region and a drain region of p-type formed in a part of said silicon substrate corresponding to said second device region at respective lateral sides of said second gate electrode at outer sides of sidewall insulation films formed on respective sidewall surfaces of said second gate electrode so as to overlap partially with said source extension region of p-type and said drain extension region of p-type respectively;

an interlayer insulation film extending over said first and second device regions on said silicon substrate so as to cover said n-channel MOS transistor and said p-channel MOS transistor;

first and second contact plugs formed in said interlayer insulation film in correspondence to said source region and drain region of n-type;

third and fourth contact plugs formed in said interlayer insulation film in correspondence to said source region and drain region of p-type, said first and second contact plugs carrying first and second tensile stress source of any of a metal and a metal compound on respective tip end parts thereof in contact with said source region of n-type and said drain region of n-type, said third and fourth contact plugs carrying third and fourth compressive stress source of any of a metal and a metal compound on respective tip end parts thereof in contact with said source region of p-type and said drain region of p-type.

In still other aspect, the present invention provides a method of fabricating a p-channel MOS transistor, comprising the steps of:

forming a gate electrode on a silicon substrate in correspondence to a channel region;

forming a source region of p-type and a drain region of p-type in said silicon substrate at respective lateral sides of said gate electrode;

forming recess regions in each of said source region and drain region of p-type;

covering a surface said recess regions with a refractory metal silicide film along the shape of said recess regions; and depositing a metal or metal compound film on said refractory metal silicide film so as to fill said recess regions under a condition such that said metal or metal compound film accumulates therein a compressive stress.

In further aspect, the present invention provides a method of fabricating a semiconductor integrated circuit device including therein a p-channel MOS transistor and an n-channel MOS transistor on a silicon substrate defined with first and second device regions by a device isolation region, comprising the steps of:

forming an n-channel MOS transistor having an n-type source region and an n-type drain region on said device region and forming a p-channel MOS transistor having a p-type source region and a p-type drain region on said second device region;

forming an interlayer insulation film on said silicon substrate over said first and second device regions so as to cover said n-channel MOS transistor and said p-channel MOS transistor;

forming first and second conductive plugs in said interlayer insulation film in contact respectively with said source region of n-type and said drain region of n-type, such that said first and second conductive plugs filling first and second contact holes formed in said interlayer insulation film respectively in correspondence said source region of n-type and said drain region of n-type;

crystallizing said first and second conductive plugs by a thermal annealing process;

forming, after said step of crystallization, third and fourth contact holes in said interlayer insulation film so as to expose said p-type source region and said p-type drain region respectively; and filling at least a bottom part of said third and fourth contact holes with a metal or a metal compound, said metal or metal compound being deposited under a condition that a compressive stress is accumulated therein.

According to the present invention, it becomes possible to apply a compressive stress to the channel region of the p-channel MOS transistor directly in the channel direction by forming recesses in the source and drain regions of the p-channel MOS transistor and filling the same with metal or metal compound accumulating therein a compressive stress.

For example, by filling such source and drain regions with a material having a lattice constant larger than that of the silicon substrate such as a SiGe mixed crystal, it becomes possible to realize a far larger compressive stress as compared with the case in which a compressive stress is induced in the channel region indirectly according to the mechanism explained previously with reference to FIG. 2. With this, the p-channel MOS transistor of the present invention can realize a considerably larger hole mobility and high-speed operation as compared with conventional stressed p-channel MOS transistors.

Further, according to the present invention, there is realized a very large compressive stress by the compressive stress source formed of metal or metal compound formed in the p-type source region or p-type drain region, and it is possible to realize sufficient improvement of hole mobility by merely forming such a compressive stress source in a contact plug that makes contact with the source or drain region.

It should be noted that such a metal film or metal compound film causes shrinkage with recrystallization associated with thermal annealing process, and the stress accumulated therein is changed to tensile stress. Thus, it is possible with the present invention to induce a tensile stress acting on the channel region of an n-channel MOS transistor in the channel direction by forming a similar metal film or metal compound film in the contact plugs making contact with the source and drain regions of the n-channel MOS transistor and further applying a thermal annealing process.

Further, it is possible to induce a tensile stress acting in the channel direction in the channel region of an n-channel MOS transistor by: forming an n-channel MOS transistor and a p-channel MOS transistor respectively in the first and second device regions on the silicon substrate; forming a conductive plug of metal or metal compound in the source and drain regions of the n-channel MOS transistor; forming a tensile stress source by applying a thermal annealing process; and further forming a conductive plug of the metal or metal compound in the source and drain regions of the p-channel MOS transistor on the second device region of the same silicon substrate at the temperature in the range from room temperature to 300° C. Thereby a high-speed semiconductor integrated circuit device in which compressive stress is induced in the channel region of the p-channel MOS transistor in the channel direction is obtained.

Other objects and further features of the present invention will become apparent from the following detailed description when read in conjunction with the attached drawings.

BRIEF DESCRIPTION OF THE DRAWINGS

FIG. 4 is a diagram showing the stress distribution in the p-channel MOS transistor of FIG. 3;

FIGS. 7A-7H are diagrams showing the fabrication process of a semiconductor integrated circuit device according to a second embodiment of the present invention;

FIGS. 10A-10E are diagrams shows the fabrication process of a semiconductor integrated circuit device according to a fourth embodiment of the present invention; and FIG. 11 is a diagram showing a modification of the first embodiment of the present invention.

DETAILED DESCRIPTION OF THE INVENTION

First Embodiment

Figure 3:
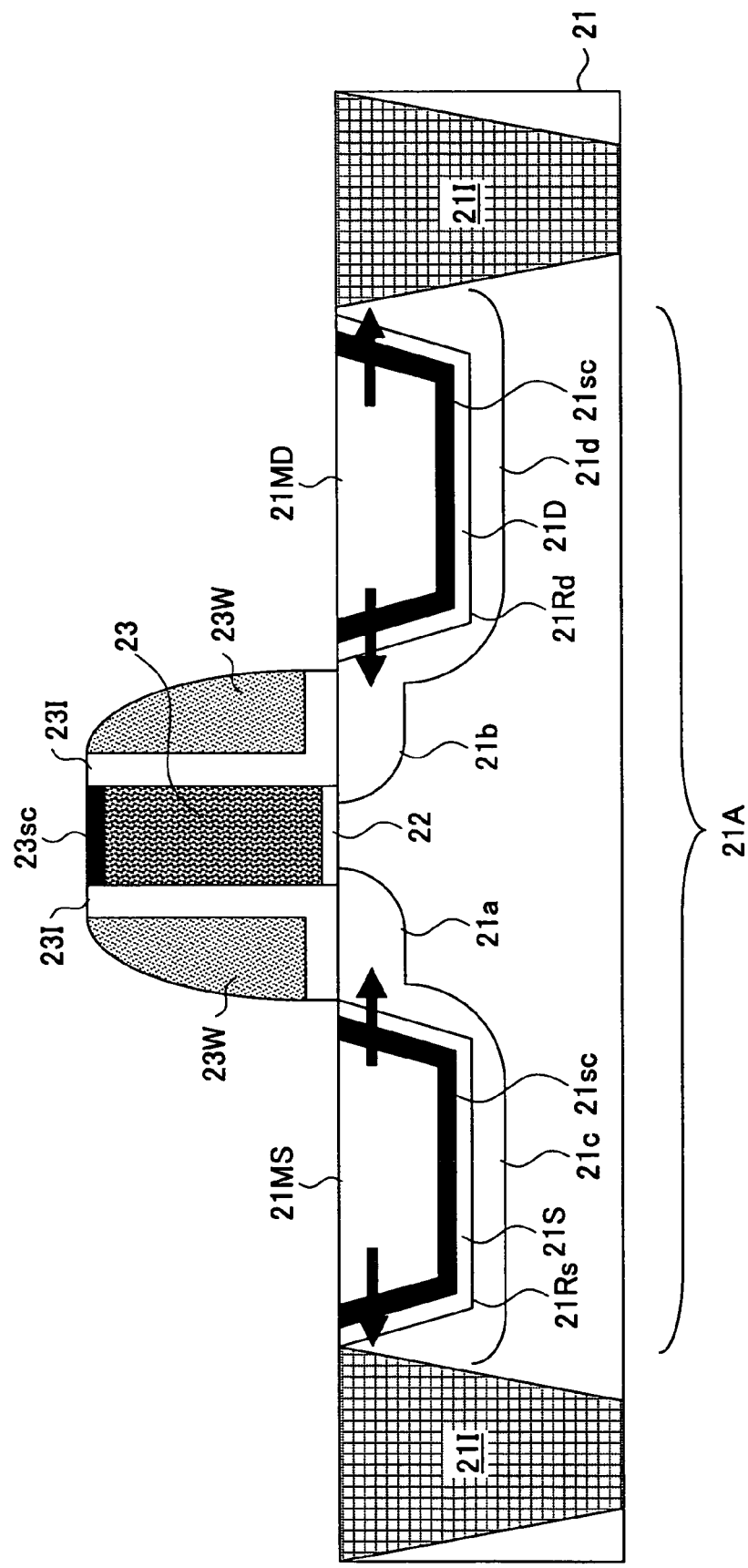
FIG. 3 is a diagram showing the construction of a p-channel MOS transistor according to a first embodiment of the present invention.

FIG. 3 shows the construction of a p-channel MOS transistor 20 according to a first embodiment of the present invention.

Referring to FIG. 3, the p-channel MOS transistor 20 is a device having a gate length of 100 nm or less and formed on a device region of a silicon substrate 21 in which an n-type well 21A is formed by an STI region 21I.

On the silicon substrate 21, a polysilicon gate electrode 23 of p+-type is formed in corresponding to a channel formed in the device region 21A via a gate insulation film 22 of SiON or so-called high-K material, typically with the film thickness of 1-1.2 nm.

In the silicon substrate 21, a source extension region 21a and a drain extension region 21b of p-type are formed at respective lateral sides of the gate electrode 23, and sidewall insulation films 23W of SiN are formed on respective, mutually opposing sidewall surfaces of the gate electrode 23 via respective CVD sidewall oxide films 23I. It should be noted that each CVD sidewall oxide film 23I covers the sidewall surface of the polysilicon gate electrode 23 and a part of the surface of the silicon substrate 21 near the gate electrode 23 continuously. With this, direct contact of the SiN sidewall insulation film 23W with the surface of silicon substrate 21 is avoided.

Further, in the silicon substrate 21, there are formed source and drain regions 21c and 21d of p+-type in a part of the device region 21A at respective outer sides of the source and the drain extension regions 21a and 21b, and recesses 21Rs and 21Rd are formed in the source and drain regions 21c and 21d at respective outer sides of the gate sidewall insulation films 23W with a depth not exceeding the bottom edge of the source region 21c or the drain region 21d such as 30 nm. Thereby, the surface of the recesses 21Rs and 21Rd are doped to a higher concentration level with B as compared with the source region 21c or the drain region 21d, and the respective recesses 21Rs and 21Rd thus formed are covered with epitaxial layers 21S and 21D of p-type Si that function as a low resistance contact layer.

It should be noted that there are formed recess surfaces similar to the recess surfaces 21Rs and 21Rd on the surface of the epitaxial layers 21S and 21D of p-type Si, wherein each recess surface in the epitaxial layers 21S and 21D is covered by an Ni silicide (NiSi) film 21sc having a thickness of about 5 nm. Further, TiN films 21MS and 21MDs are formed so as to fill the recesses and thus on the Ni silicide film 21sc.

It should be noted that the TiN films 21MS and 21MDs are formed by a sputtering process or ALD process at the substrate temperature in the range from room temperature to 300° C. Thereby the TiN film thus deposited at low temperature accumulates a compressive stress and exerts a compressive stress to the silicon substrate 21 constituting the recess as represented by arrows shown in FIG. 3. As a result, compressive stress acting in the channel direction is applied to the channel region of the p-channel MOS transistor 20 from both lateral sides.

Here, it should be noted that the compressive stress acting on the channel region of the p-channel MOS transistor 20 is exerted when the TiN films 21MS and 21 MDs cause dilatation for canceling out the compressive stress accumulated therein and is thus exerted to the channel region directly.

FIG. 4 shows the stress distribution obtained for the p-channel MOS transistor 20 of FIG. 3 by convergence electron beam analysis, while Table 1 below shows the values of lattice constant, strain and stress at the points 1-4 in FIG. 4, wherein in the measurement of FIG. 4, it should be noted that the p-channel MOS transistor 20 has a gate length of 40 nm and that there is formed an SiN film having a thickness of 80 nm and accumulating therein a compressive/tensile stress of 1.2 GPa on the gate electrode 23 so as to cover the sidewall insulation films 23W and the surface of the silicon substrate 21 including the TiN films 21MS and 21 MDs.

TABLE 1

| | In stress-free Si: X = Y = Z = 5.4307A | | | | | |
|---|---|---|---|---|---|---|
| Area | X(=Z) (A) | Y(A) | εXX | εYY | σXX(MPa) | σYY(MPa) |
| #1 | 5.4101 | 5.4597 | −3.80E−03 | 5.30E−03 | −1335 | 878 |
| #2 | 5.4126 | 5.4545 | −3.30E−03 | 4.40E−03 | −1104 | 656 |
| #3 | 5.3483 | 5.436 | −1.50E−02 | 9.80E−04 | −17593 | −3972 |
| #4 | 5.3192 | 5.3192 | −2.10E−02 | −2.10E−02 | −13450 | −13388 |

Referring to FIG. 4 and Table 1, there is induced a compressive stress in the channel region right underneath the gate electrode represented by the point #1 in which a compressive stress σXX of 1335 MPa is induced. It should be noted that the point #1 is located right underneath the gate insulation film. Further, it can be seen that a compressive stress σXX of 1104 MPa is induced in the channel direction in the point #2 located at the depth of about 30 nm from the gate insulation film.

Further, in the point #1, it can be seen that a tensile stress σYY of 878 MPa is induced in the direction perpendicular to the silicon substrate, while in the point #2, it can be seen that there is induced a tensile stress σYY of 656 MPa in the direction perpendicular to the silicon substrate. In Table 1, it should be noted that compressive stress has a negative value and tensile stress has a positive value. Further, expression of stress and strain is based on the coordinate system shown in FIG. 4.

In Table 1, it is noted that there is an increase in the value of εXX or εYY in the points #3 and #4, while this means that there is caused plastic deformation in such regions.

Generally, the effect of the stress acting in the channel direction on the effective mobility of the p-channel MOS transistor is represented by the equation $$\Delta\mu/\mu = |\pi_{II}\sigma_{II} + \pi_{\perp}\sigma_{\perp}|$$ (Non-patent Reference 3 and 4)

Figure 5:
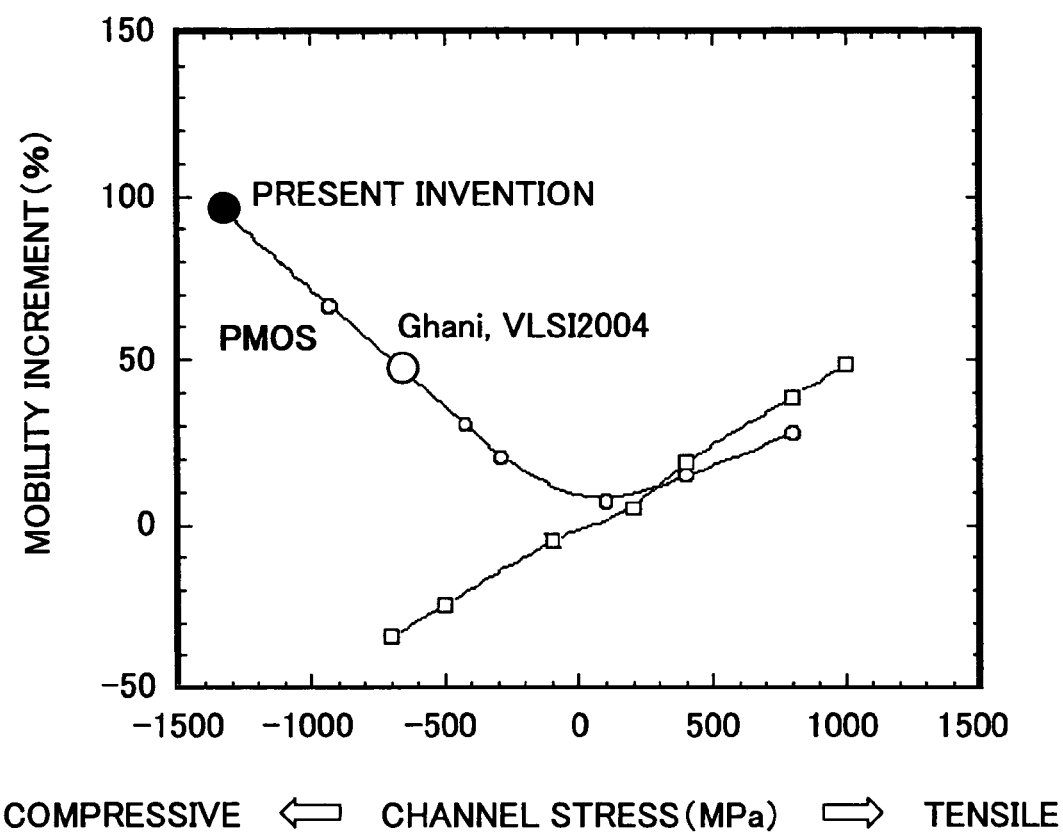
FIG. 5 is a diagram showing the increase rate of mobility of the MOS transistor of FIG. 3 in comparison with a conventional stressed p-channel MOS transistor.

FIG. 5 shows the change rate of hole mobility by the stress induced in the channel region in such a p-channel MOS transistor.

As can be seen from FIG. 5, an increase of mobility of 100% has been achieved as compared with the case where no stressing is made, provided that a compressive stress of 1335 MPa has been induced in the part of the channel region right underneath the gate electrode of the p-channel MOS transistor.

Figure 1:
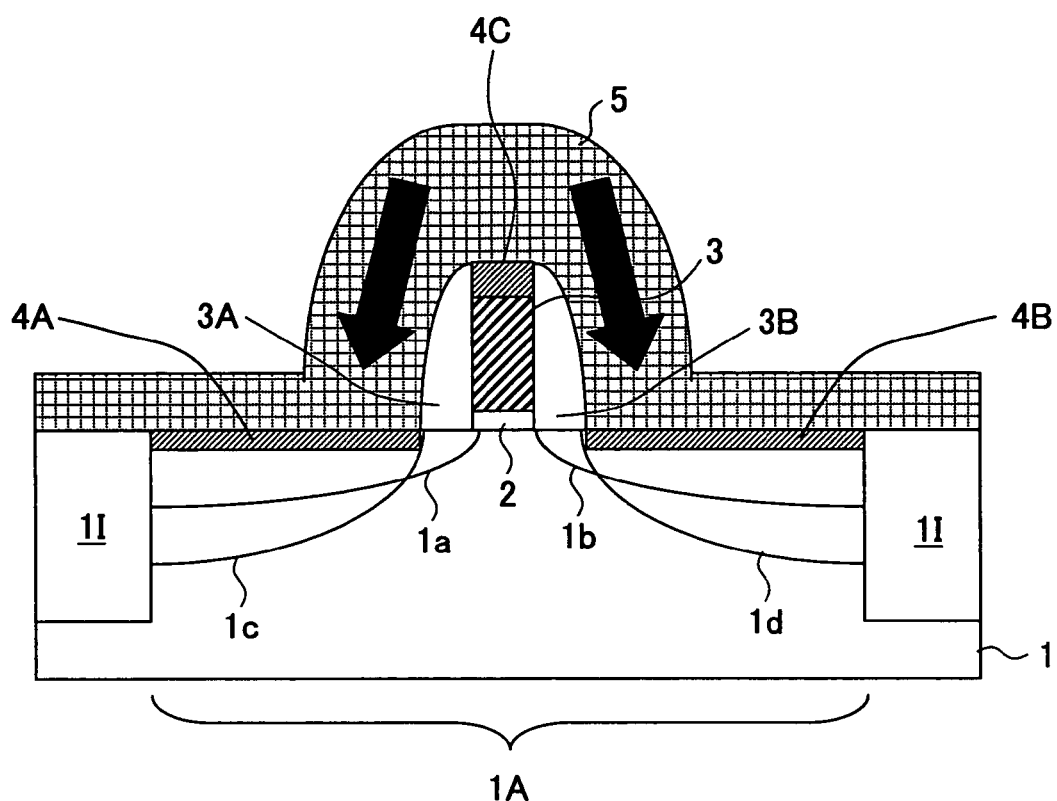
FIG. 1 is a diagram explaining the principle of a conventional stressed n-channel MOS transistor.
Figure 2:
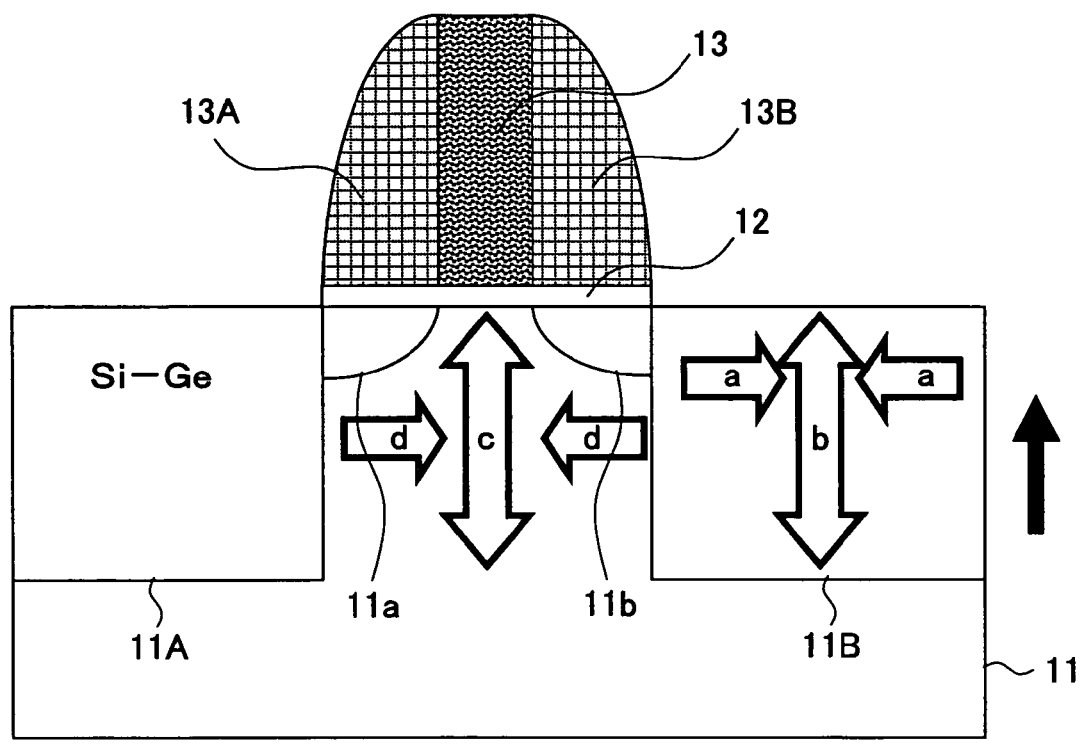
FIG. 2 is a diagram explaining the principle of a conventional stressed p-channel MOS transistor.

In FIG. 5, it should be noted that the mobility change reported in Non-Patent Reference 2 for the p-channel MOS transistor, in which the hole mobility in the channel region is improved by the mechanism of FIG. 2, is represented in addition to the case of the present invention. With this construction of Non-Patent Reference 2, in which a SiGe mixed crystal layer of $Si_{0.8}Ge_{0.2}$ in composition is buried in the source and drain regions, the compressive stress induced in the channel region is merely in the order of 0.6 GPa, and increase rate of mobility does not reach 50%.

Further, with the present invention, in which the recesses 21Rs and 21Rd are filled with TiN films 21MS and 21MDs of low resistivity ($\rho \cong 1 \times 10^{-3}$ $\Omega$cm), the source parasitic resistance can be reduced by the factor of ten as compared with the case of Non-Patent Reference 2 that uses the in-situ doped SiGe mixed crystal layers, and the operational speed of the p-channel MOS transistor is improved further.

In the p-channel MOS transistor 20 of FIG. 3, it is also conceivable to form the whole of the source and drain regions 21c and 21d with metal or metal compound such as TiN and increase the compressive stress applied to the channel region further, while with such a construction, there is formed a Schottky junction at the interface between the source/drain region and the device region 21A of n-type well and increase of junction leakage current results.

Further, in the case the TiN films 21MS and 21MDs carrying thereon the silicide layer 21Sc are formed directly in the source region 21c or drain region 21d with the construction of FIG. 3, there occurs decrease of carrier density in the part of the source and drain regions 21c and 21d where the bottom of the TiN films 21MS and 21 MDs makes contact via the silicide layer 21Sc as compared with the part close to the substrate surface, in view of the fact that doping of the source and drain regions 21c and 21d is achieved by diffusion of the impurity element introduced with ion implantation process, and thus, there arises a problem in that there occurs increase of contact resistance with such a part.

Thus, with the construction of FIG. 3, increase of contact resistance is avoided by increasing the carrier density at the bottom part of the source region 21c and the drain region 21d, by growing the in-situ doped Si epitaxial layers 21S and 21D doped with B to high concentration level, after formation of the recesses 21Rs and 21Rd. Further, by growing the in-situ doped Si epitaxial layers 21S and 21D, it becomes possible to dope the source and drain regions underneath to high concentration level by B that has caused diffusion from the Si epitaxial layers 21S and 21D.

Furthermore, FIG. 3 corresponds to the case in which the recesses 21Rs and 21Rd are defined by crystal surface, and thus, the Si epitaxial layers 21S and 21D are grown not only at the bottom surfaces of the recesses 21Rs and 21Rd but also on the inclined sidewall surfaces. On the other hand, in the case the recesses 21Rs and 21Rd are formed by a dry etching process and thus have inclined sidewall surfaces not formed by a crystal surface, the in-situ doped Si epitaxial layers 21D and 21D of high impurity concentration are grown selectively on the bottom surface of the recesses, while even in such a case, it is possible to reduce the contact resistance between the metal or metal compound layer 21MS or 21MDs and the source or drain region 21c or 21d effectively.

In the present embodiment, it should be noted that silicide formation is not limited to formation of the NiSi layer, and it is possible to use $TiSi_2$, $CoSi_2$, $TaSi_2$, PtSi, IrSi, or the like, having a lattice constant larger than the lattice constant of Si constituting the silicon substrate 21.

Further, it should be noted that the metal or metal compound filling the recesses 21Rs and 21Rd in the present embodiment is not limited to TiN, but it is possible to use most metals such as Ti, Ta, W, Cr, Mo, and the like, or a conductive nitride thereof, to form a film at a comparatively low substrate temperature of less than 300° C. including room temperature, by way sputtering, or the like.

Figure 6:
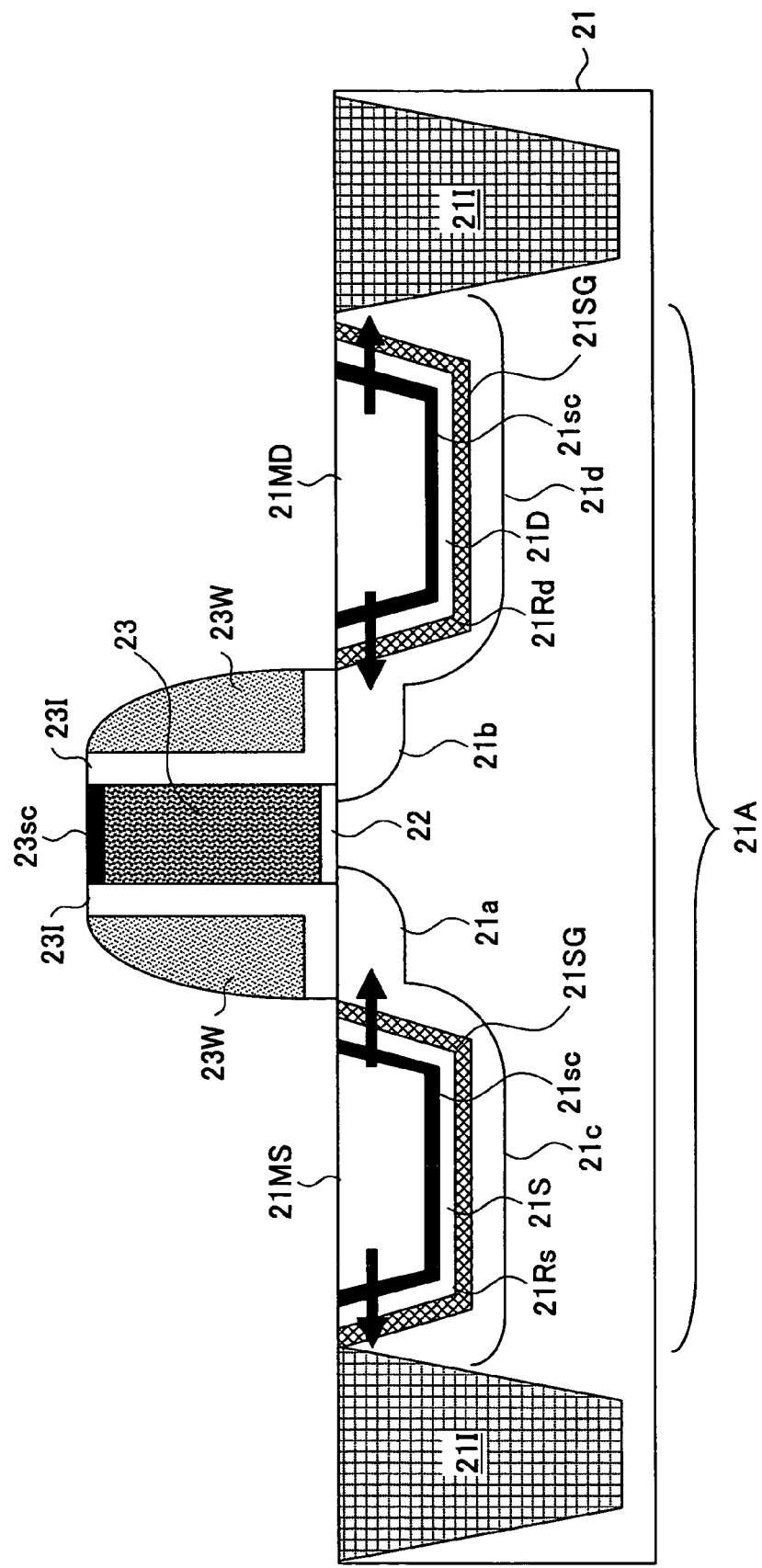
FIG. 6 is a diagram showing a modification of the p-channel MOS transistor of FIG. 3.

FIG. 6 shows the construction of a p-channel MOS transistor 20A according to a modification of the p-channel MOS transistor 20 of FIG. 3, wherein those parts of FIG. 6 corresponding to the parts explained previously are designated by the same reference numerals and the description thereof will be omitted.

Referring to FIG. 6, there are formed epitaxial layers 21SG of $p^+$-type SiGe underneath the $p^+$-type in-situ doped Si epitaxial layers 21S and 21D doped by B with the present embodiment, and thus, the carrier density of the source and drain diffusion regions 21c and 21d underneath the SiGe layer 21SG is increased. Thereby, the problem of increase of contact resistance with formation of the compressive stress sources 21MS and 21MDs of metal or metal compound is successfully avoided. Further, in the construction of FIG. 6, the SiGe epitaxial layer 21SG has a reduced thickness, and thus, the function of stressor is not expected for the SiGe epitaxial layers 21SG. It should be noted that such an in-situ doped SiGe epitaxial layer 21SG can be formed by a low-pressure CVD process at the substrate temperature of 450° C. while supplying $SiH_4$ and $GeH_4$ as gaseous source and $B_2H_6$ as a dopant gas.

Further, in the construction of FIG. 3, it is possible to form the in-situ doped SiGe epitaxial layer 21SG in place of the in-situ doped Si epitaxial layers 21S and 21D.

Second Embodiment

Next, fabrication process of a semiconductor integrated circuit device 40 according to a second embodiment of the present invention including therein a p-channel MOS transistor corresponding to the p-channel MOS transistor 20 of FIG. 3 and further an n-channel MOS transistor will be described with reference to FIGS. 7A-7H.

Referring to FIG. 7A, there are defined a device region 41A for an n-channel MOS transistor and a device region 41B for a p-channel MOS transistor on a silicon substrate 41 by a device isolation structure 41I, and an $n^+$-type polysilicon gate electrode 43A is formed on the silicon substrate 41 in the device region 41A via a gate insulation film 42A in correspondence to the channel region of the n-channel MOS transistor. Further, in the device region 41B, a $p^+$-type polysilicon gate electrode 43B is formed on the silicon substrate 41 via a gate insulation film 42B in correspondence to the channel region of the p-channel MOS transistor.

Further, SiN sidewall insulation films 43NA are formed on the respective sidewall surfaces of the polysilicon gate electrode 43A via respective CVD oxide films 43IA. Similarly, SiN sidewall insulation films 43NB are formed on respective sidewall surfaces of the polysilicon gate electrode 43B via respective CVD oxide films 43IB.

In the device region 41A, source extension regions 41a and 41b of n-type are formed in the silicon substrate 41 at respective lateral sides of the gate electrode 43A, while in the device region 41B, on the other hand, source and drain extension regions 41e and 41f of p-type are formed in the silicon substrate 41 at respective lateral sides of the gate electrode 43B. Further, in the device region 41A, source regions 41c and 41d of n⁺-type are formed in the silicon substrate 41 at respective outer sides of the n-type source extension regions 41*a* and 41*b*, and in the device region 41B, source and drain regions 41*g* and 41*h* of p⁺-type are formed in the silicon substrate 41 at respective outer sides of the p-type source and drain extension regions 41*e* and 41*f*.

Next, in the process of FIG. 7B, the silicon substrate 41 is subjected to an etching process in the device region 41B for the part outside the sidewall insulation films 43NB while using a silicon oxide (not shown) as the mask, and recesses 41Rs and 41Rd are formed so as to be included in the source and drain regions 41*g* and 41*h* of p-type respectively with a depth of 30 nm, for example.

Further, in the step of FIG. 7C, Si layers 41S and 41D doped with B to a high concentration level are grown epitaxially on the respective surfaces of the recesses 41Rs and 41Rd by a low-pressure CVD process that uses a SiH₄ gas as the gaseous source and B₂H₆ (diborane) as the dopant gas. Further, with a salicide process, silicide layers 41*s* and 41*dc* of NiSi are formed on the surface of the source and drain regions 41*c* and 41*d* of n⁺-type exposed in the device region 41A and a silicide layer 43As of NiSi is formed on the surface of the polysilicon gate electrode of n⁺-type.

At the same time, silicide layers 41*gc* and 41*hc* of NiSi are formed respectively on the p⁺-type Si epitaxial layers 41S and 41D formed on the source region 41*g* of p⁺-type and the drain region 41*h* of p⁺-type. Further, a silicide layer 43Bs of NiSi is formed on the polysilicon gate electrode 43B at the same time.

For example the silicide layer is formed, after formation of the Si epitaxial layers 41S and 41D, on the structure of FIG. 7B, by depositing a Ni film with a film thickness of about 5 nm and subsequently annealing at the temperature of 250-400° C. over the duration of 10-30 seconds. Thereafter, unreacted Ni film is removed by a processing in a per sulfuric acid processing.

Figure 7D:
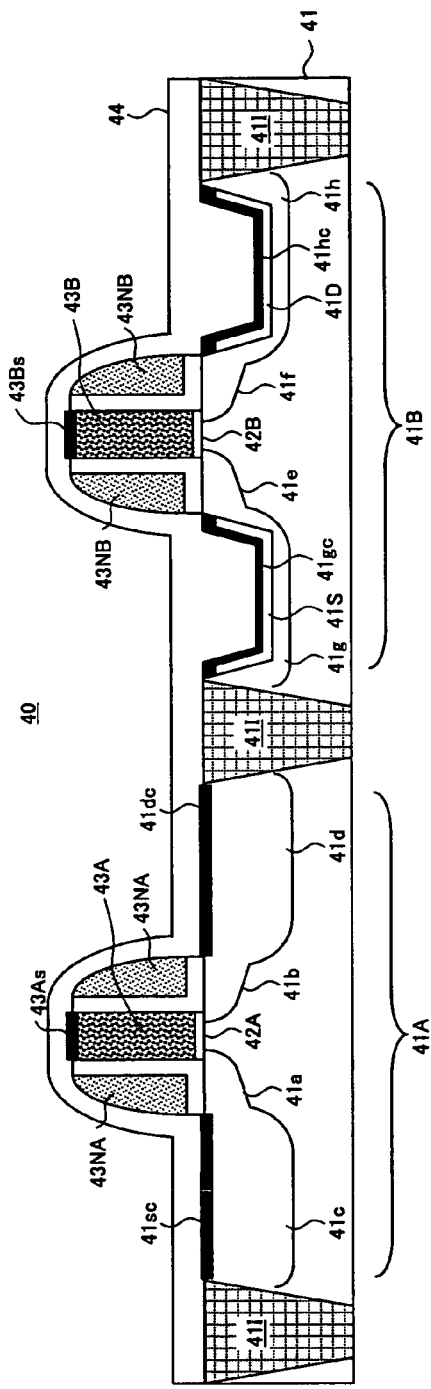

Next, in the step of FIG. 7D, a TiN film 44 is deposited on the structure of FIG. 7C by a sputtering process with a film thickness of 40 nm while setting the substrate temperature to the range from room temperature to 300° C. As explained previously, the TiN film 44 deposited at such a low temperature accumulates therein a large compressive stress and functions as the compressive stress source in the part filling the recesses 41Rs and 41Rd.

Figure 7E:
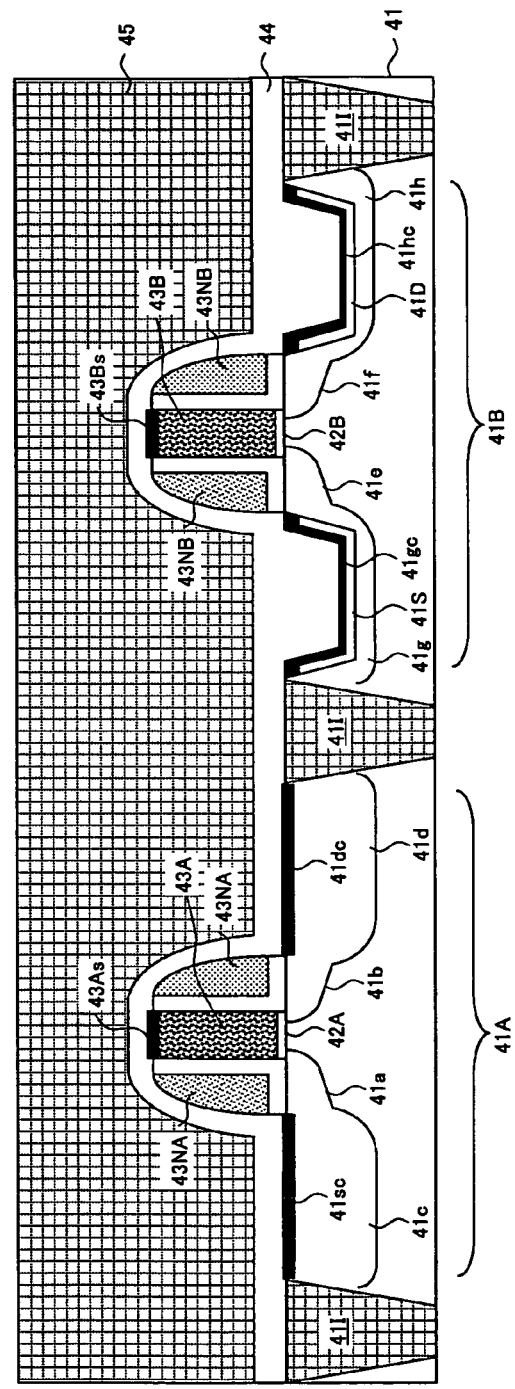
Figure 7H:
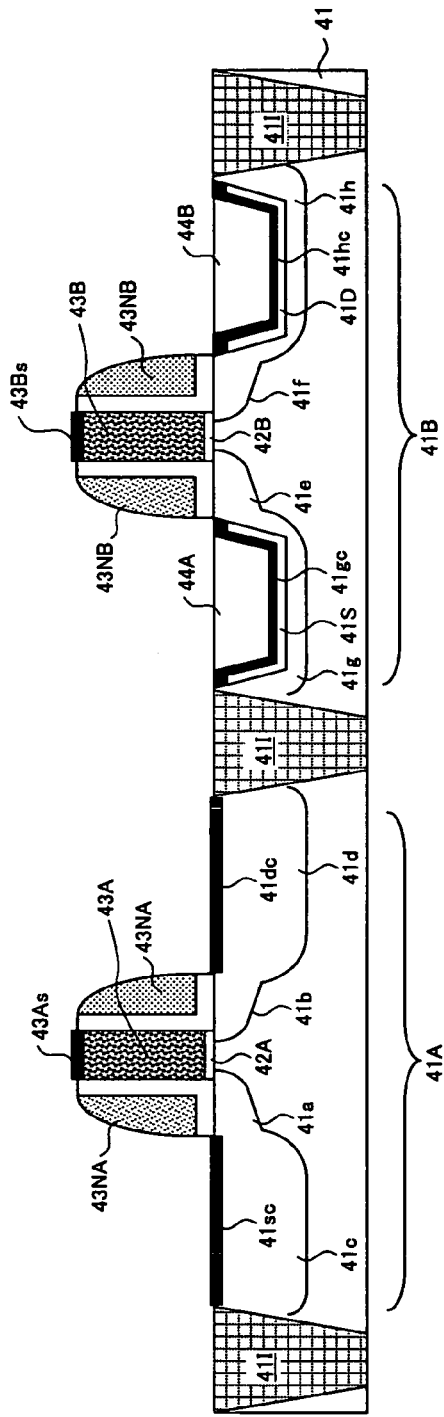

Further, in the step of FIG. 7E, a silicon oxide film 45 is deposited by a plasma CVD process with the film thickness of about 200 nm at the substrate temperature not exceeding 400° C.

Next, in the step of FIG. 7F, the silicon oxide film 45 is polished by a CMP process until the TiN film 44 covering the gate electrodes 43A and 43B is exposed, and further in the step of FIG. 7G, the TiN film 44 is removed from the opening formed in the silicon oxide film 45 as shown in FIG. 7G by an arrow by a wet etching process.

Further, the silicon oxide film 45 is removed and the TiN film 44 remaining on the silicon substrate 41 is removed. With this, the semiconductor integrated circuit device shown in FIG. 7H in which the n-channel MOS transistor and the p-channel MOS transistor are integrated on the silicon substrate 41 such that the recesses 41Rs and 41Rd formed in the source and drain regions of the p-channel MOS transistor are filled with the TiN films 44A and 44B is obtained.

With the present embodiment too, it is possible to use TiSi₂, NiSi, CoSi₂, TaSi₂, PtSi, IrSi, and the like, as the silicide layers 41*sc*, 41*dc*, 41*gc*, 41*hc*, 43As and 43Bs. Further, it is possible to deposit most of the metals such as Ti, Ta, W, Cr, Mo, and the like, or a conductive nitride thereof, in place of the TiN films 44A and 44B by a sputtering process, for example, at a relatively low substrate temperature of 300° C. or less including room temperature.

Third Embodiment

Meanwhile, according to the previous result of analysis of FIG. 4, it can be seen that it is possible to induce a large compressive stress in the channel region by using the construction of FIG. 3 even in the case the compressive stress source is formed with a distance of about 100 nm from the channel region. This means that, even in an ordinary p-channel MOS transistor, it is possible to achieve increase of hole mobility in the channel region by forming a metal or metal compound acting as a compressive stress source at the bottom part of the source and drain contact holes.

Figure 8:
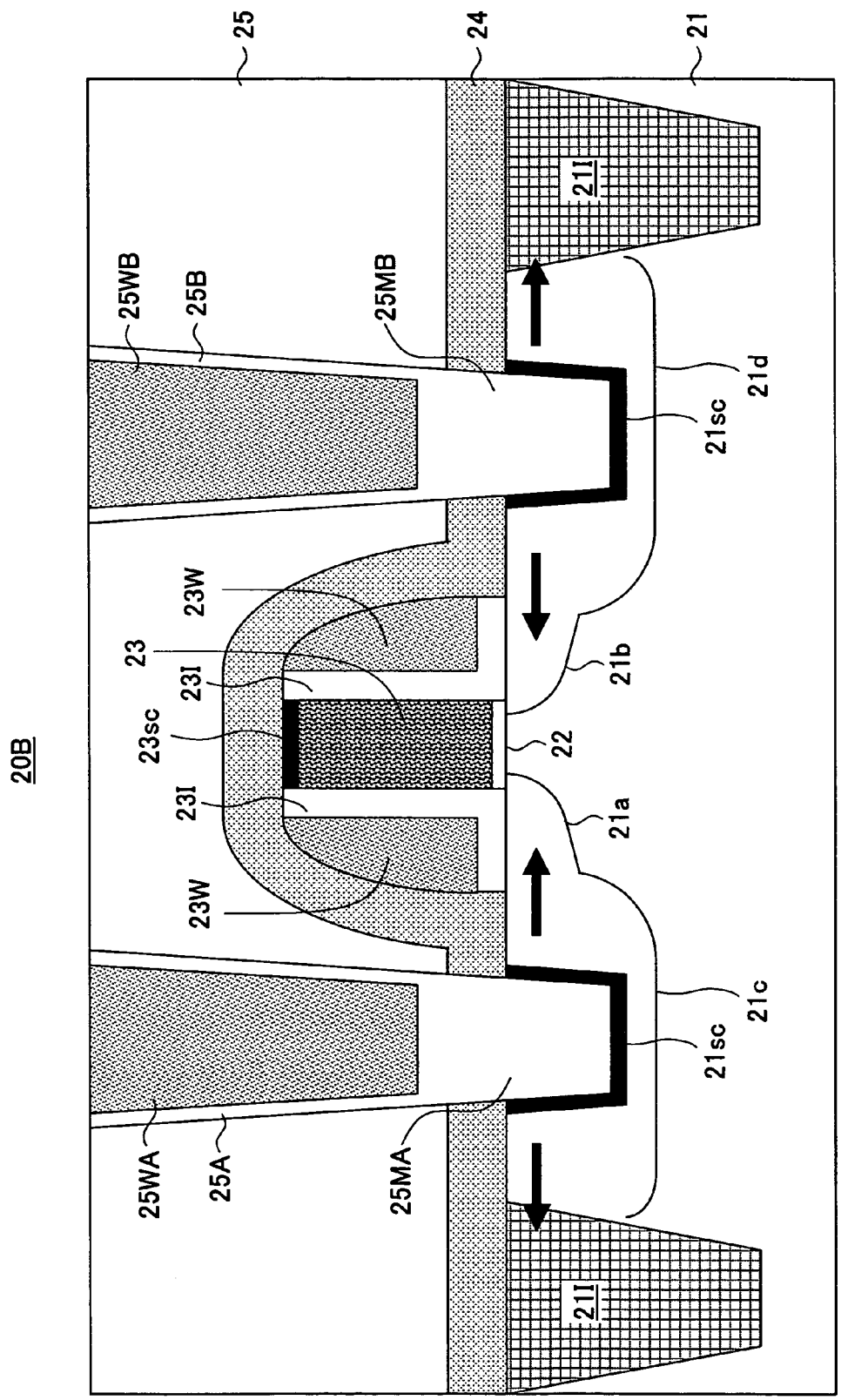
FIG. 8 is a diagram showing the construction of a p-channel MOS transistor according to a third embodiment of the present invention.

FIG. 8 is a diagram showing the construction of a p-channel MOS transistor according to a third embodiment of the present invention based on such a concept, wherein those parts corresponding to the parts explained previously are designated by the same reference numerals and the description thereof will be omitted.

Referring to FIG. 8, a contact etching stopper film 24 of SiN is formed, with the present embodiment, on the silicon substrate 21, in which the source and drain extension regions 21*a* and 21*b* of p-type and source and drain regions 21*c* and 21*d* of p⁺-type are formed in the device region 21A defined by the device isolation region 21I, such that the contact etching stopper film 24 covers the polysilicon gate electrode 23 and the sidewall insulation films 23I and 23W continuously. Further, an interlayer insulation film 25 is formed on the contact-etching stopper film 24. Here, the SiN film constitutes the contact-etching stopper 24 is deposited with such a condition that there occurs no accumulation of compressive stress in the film.

Further, a contact hole 25A is formed in the interlayer insulation film 25 in correspondence to the source region 21*c* and a contact hole 25B is formed in correspondence to the drain region 21*d*.

Here, it should be noted that the contact hole 25A penetrates into the contact-etching stopper film 24 and invades further into the source region 21*c* and thus forms a recess corresponding to the recess 21Rs. Similarly, the contact hole 25B penetrates into the contact-etching stopper film 24 and invades further into the drain region 21*d* and thus forms the recess corresponding to the recess 21Rd.

In the source region 21*c*, a silicide layer 21*sc* is formed at the bottom surface and sidewall surface of the recess, while similar silicide layer 21*c* is formed on the bottom surface and sidewall surfaces of the recesses formed in the drain region 21*d*.

Further, a metal layer 25MA of TiN is formed at the bottom part of the contact hole 25A so as to fill the recess, and the metal layer 25MA forms a metal liner covering the sidewall surface of the contact hole 25A in the upward part of the contact hole 25A. Further, in the contact hole 25A, the metal layer 25MA is covered by a W-plug 25WA. Similarly, a metal layer 25MB of TiN is formed at the bottom part of the contact hole 25B so as to fill the recess, and the metal layer 25MB forms a metal liner in the upward part of the contact hole 25B by covering the sidewall surface of the contact hole 25B. Further, in the contact hole 25B, the metal layer 25MB is covered with a W-plug 25WB.

With such a construction, too, the metal layers 25MA and 25MB exhibit tendency of dilatation because of the compressive stress accumulated therein, and thus, it becomes possible to induce a compressive stress in the channel region right underneath the gate electrode 23 as shown in the drawing by the arrows.

In the present embodiment, too, it is possible to use TiSi$_2$, NiSi, CoSi$_2$, TaSi$_2$, PtSi, IrSi, and the like, for the silicide layer. Further it is possible to deposit most of the metals such as Ti, Ta, W, Cr, Mo, and the like, or a conductive nitride thereof, in place of the TiN films 44A and 44B by a sputtering, for example, at a relatively low substrate temperature of 300° C. or less including room temperature.

Figure 9:
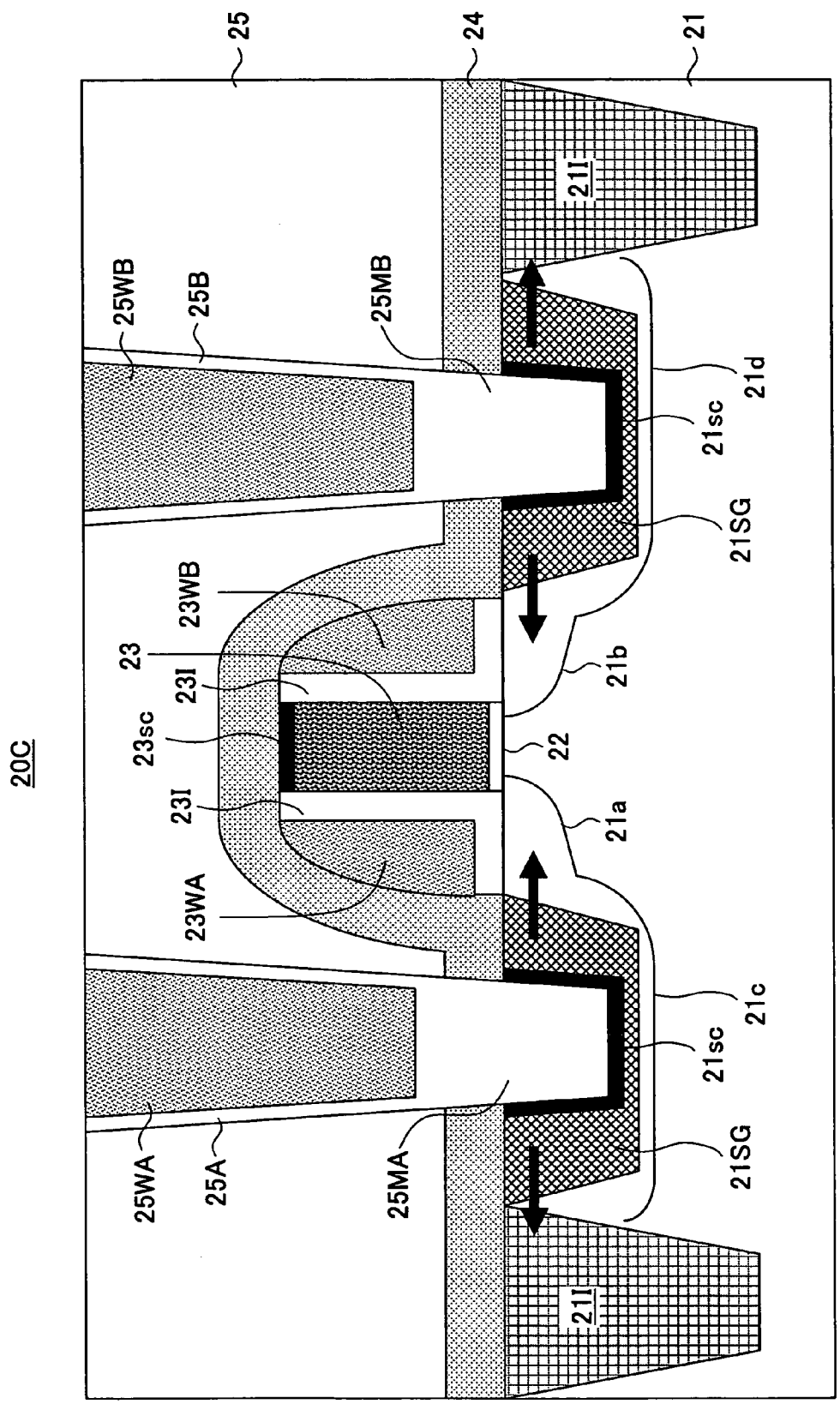
FIG. 9 is a diagram showing a modification of the p-channel MOS transistor of FIG. 8.

FIG. 9 shows the construction of a p-channel MOS transistor 20C according to a modification of the p-channel MOS transistor 20B of FIG. 8, wherein those parts corresponding to the parts explained previously are designated by the same reference numerals and the description thereof will be omitted.

Referring to FIG. 9, SiGe mixed crystal layers 21SG of p$^+$-type formed with in-situ doping process is formed epitaxially with the present embodiment so as to fill the recesses in the source and drain regions 21c and 21d of p-type, and the compressive stress sources 25MA and 25MB are formed so as to fill the recesses thus formed in the SiGe mixed crystal layers 21SG.

According to such a construction, it becomes possible to realize high carrier concentration also in the deep part of the source and drain regions 21c and 21d of p-type and further to reduce the contact resistance to the compressive stress sources 25MA and 25MB of metal or metal compound.

Fourth Embodiment

FIGS. 10A-10E are diagrams showing the fabrication process of a semiconductor integrated circuit device 60 according to a fourth embodiment of the present invention in which an n-channel MOS transistor and a p-channel MOS transistor are integrated on the same silicon substrate, wherein those parts corresponding to the parts explained previously are designated by the same reference numerals and the description thereof will be omitted.

With the present embodiment, tensile stress is applied to the channel region for improvement of the operational speed by using the construction similar to the one explained with reference to FIG. 11 for the p-channel MOS transistor and by forming a tensile stress source to the lower part of the contact plug with regard to the n-channel MOS transistor.

Referring to FIG. 10A, an SiN film 61A accumulating therein a tensile stress is formed on the structure of FIG. 7A explained previously with the present embodiment so as to cover the device region 41A including the gate electrode 43A and the sidewall insulation films 41WA, and an SiN film 61B free from stress or accumulating therein a compressive stress is formed on the device region 41B so as to cover the gate electrode 43B and the sidewall insulation films 41WB under a condition different from the condition used for formation of the SiN film 61A. Such relationship between the film stress and film formation condition in such a SiN film is known and the explanation thereof will be omitted.

With the step of FIG. 10A, an insulation film 62 is formed on the SiN films 61A and 61B, and contact holes 62A and 62B are formed in an interlayer insulation film 62 so as to expose the source region 41c and the drain region 41d of n-type in the device region 41A and such that recesses are formed in the source region 41c and the drain region 41d, and silicide films 41sc and 42dc are formed at the sidewall surface and bottom surface of the recesses.

Next, in the step of FIG. 10B, TiN films 62MA and 62MB are formed by a sputtering process so as to fill the bottoms of the contact holes 62A and 62B including the respective recesses, and the spaces in the contact holes at the upward part of the TiN films 62MA and 62MB are filled with W plugs 62WA and 62WB. Thereby, the TiN film 62MA extends upward along the sidewall surface of the contact hole 62A and forms a liner. Similarly, the TiN film 62MB extends upward along the sidewall surface of the contact hole 62B and forms a liner.

In this state, the TiN films 62MA and 62MB are formed at low temperature from the room temperature to 300° C. and thus accumulate therein a compressive stress.

Next, in the step of FIG. 10C, the structure of FIG. 10B is annealed for 30 seconds in nitrogen ambient at the temperature of 600° C., for example, and the TiN films 62MA and 62MB are crystallized, and with this, the TiN films 62MA and 62MB are converted to a tensile stress source forming a tensile stress as shown in FIG. 10C in the room temperature.

Next, in the step of FIG. 10D, contact holes 62C and 62D are formed in the interlayer insulation film 62 so as to expose the p-type source region 41g and the p-type drain region 41h in the device region 41B and such that the recesses are formed in the source and drain regions 41g and 41h in correspondence to the contact holes 62C and 62D, and silicide films 41sg and 41sh are formed on the sidewall surfaces and bottom surface of the recesses.

Figure 10E:
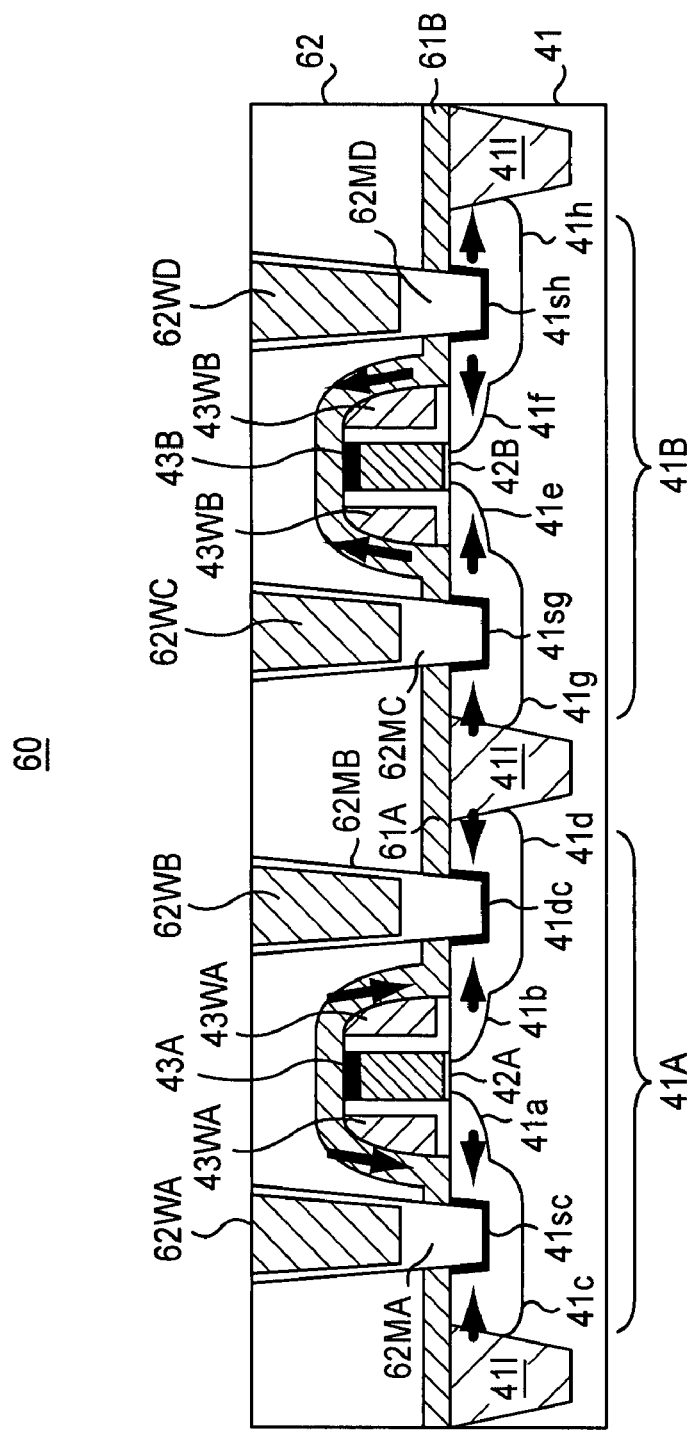

Further, in the step of FIG. 10E, TiN films 62MC and 62 MDs are formed by a sputtering process so as to fill the bottom part of the contact holes 62C and 62D, including the recesses, and the spaces formed in the contact holes over the TiN films 62MC and 62 MDs are filled up by W-plugs 62WC and 62WD. Thereby, the TiN film 62MC extends upward along the sidewall surface of the contact hole 62C and forms a liner.

Similarly, the TiN film 62 MD extends upward along the sidewall surface of the contact hole 62D and forms a liner.

The TiN films 62MC and 62 MDs thus formed accumulates compressive stress therein, and exerts a compressive stress to the channel region of the p-channel MOS transistor formed in the device region 41B as represented in FIG. 10E by the arrows.

Thus, with the semiconductor integrated circuit device 60 of FIG. 10E, it becomes possible to apply a tensile stress acting in the channel direction to the channel region of the n-channel MOS transistor and at the same time apply a compressive stress acting in the channel direction on the channel region of the p-channel MOS transistor, and thus, it becomes possible to improve the operational speed of the n-channel MOS transistor and also the p-channel MOS transistor at the same time.

Further, in any of the embodiments of the present invention, it is possible to suppress the diffusion of metallic element into the source and drain regions, in the case of forming the compressive stress sources 21MS and 21MDs by a metal film as shown in FIG. 11, by covering the metal film with a metal nitride film 21MN.

Further, the present invention is not limited to the embodiments described heretofore, but various variations and modifications may be made without departing from the scope of the invention.

What is claimed is:

1. A p-channel MOS transistor, comprising:
  a silicon substrate including a channel region therein;
  a gate electrode formed on said silicon substrate in correspondence to said channel region via a gate insulation film;

a source extension region of p-type and a drain extension region of p-type formed in said silicon substrate at respective sides of said channel region;

a source region of p-type and a drain region of p-type formed in said silicon substrate at respective lateral sides of said gate electrode at respective outer sides of sidewall insulation films formed on respective sidewall surfaces of said gate electrode in a partially overlapping relationship with said source extension region of p-type and said drain extension region of p-type respectively;

a pair of trenches formed respectively in said source region of p-type and said drain region of p-type;

silicide films covering a bottom surface and a side surface of said pair of trenches, respectively;

a metal film or a conductive metal nitride film formed in each of said pair of trenches over a corresponding one of said silicide films, said metal film functioning as a compressive stress source, wherein a bottom surface of said metal film or said conductive metal nitride film is located at a level lower than an interface between said channel region and said gate insulation film.

2. A p-channel MOS transistor as claimed in claim 1, wherein said compressive stress source is formed in said silicon substrate such that a bottom of said compressive stress source is separated from an interface between said silicon substrate and said gate insulation film by at least 10 nm.

3. The p-channel MOS transistor as claimed in claim 1, wherein said compressive stress source is formed in said silicon substrate such that a bottom of said compressive stress source is separated from an interface between said silicon substrate and said gate insulation film by at least 20 nm.

4. The p-channel MOS transistor as claimed in claim 1, wherein said compressive stress source comprises TiN or W.

5. The p-channel MOS transistor as claimed in claim 1, wherein said compressive stress source comprises a metal covered with a metal nitride film.

6. The p-channel MOS transistor as claimed in claim 1, wherein said silicide film has a lattice constant larger than a lattice constant of said silicon substrate.

7. The p-channel MOS transistor as claimed in claim 1, wherein said silicide film is selected from the group consisting of $TiSi_2$, NiSi, $CoSi_2$, $TaSi_2$, PtSi and IrSi.

8. The p-channel MOS transistor as claimed in claim 1, wherein each of said source region and drain region of p-type is formed with a depression, said depression including therein a contact layer of a p-type semiconductor layer grown epitaxially to said silicon substrate and containing Si as a primary component, said contact layer being doped with an impurity concentration level higher than an impurity concentration level of said source region or drain region of p-type, said compressive stress source being formed on said contact hole and filling said depression.

9. The p-channel MOS transistor as claimed in claim 8, wherein said contact layer comprises a Si epitaxial layer.

10. The p-channel MOS transistor as claimed in claim 8, wherein said contact layer comprises a SiGe epitaxial layer.

11. The p-channel MOS transistor as claimed in claim 1, further comprising an insulation film formed over said silicon substrate so as to cover said source region and drain region of p-type, and first and second contact plugs formed in said insulation film respectively in contact with said source region and drain region of p-type, said compressive stress source being formed at a tip end of said first contact plug in said source region of p-type and at a tip end of said second contact plug in said drain region of p-type.

12. A semiconductor integrated circuit device comprising:

a silicon substrate defined with a first device region including a first channel region and a second device region including a second channel region by a device isolation region;

an n-channel MOS transistor formed on said first device region, comprising: a first gate electrode of n-type formed on said silicon substrate via a first gate insulation film in correspondence to a first channel region; a source extension region of n-type and a drain extension region of n-type formed in a part of said silicon substrate corresponding to said first device region at respective lateral sides of said first channel region; and a source region and a drain region of n-type formed in a part of said silicon substrate corresponding to said first device region at respective lateral sides of said first gate electrode at outer sides of sidewall insulation films formed on respective sidewall surfaces of said first gate electrode so as to overlap partially with said source extension region of n-type and said drain extension region of n-type respectively;

a p-channel MOS transistor formed on said second device region, comprising: a second gate electrode of p-type formed on said silicon substrate via a second gate insulation film in correspondence to a second channel region; a source extension region of p-type and a drain extension region of p-type formed in a part of said silicon substrate corresponding to said second device region at respective lateral sides of said second channel region; a source region and a drain region of p-type formed in a part of said silicon substrate corresponding to said second device region at respective lateral sides of said second gate electrode at outer sides of sidewall insulation films formed on respective sidewall surfaces of said second gate electrode so as to overlap partially with said source extension region of p-type and said drain extension region of p-type respectively; a pair of trenches formed respectively in said source region of p-type and said drain region of p-type; silicide films covering a bottom surface and a side surface of said pair of trenches, respectively; silicide films covering a bottom surface and a side surface of said pair of trenches, respectively; a metal film or a conductive metal nitride film formed in each of said pair of trenches over a corresponding one of said silicide films, said metal film functioning as a compressive stress source, a bottom surface of said metal film or said conductive metal nitride film being located at a level lower than an interface between said channel region and said gate insulation film, an interlayer insulation film extending over said first and second device regions on said silicon substrate so as to cover said n-channel MOS transistor and said p-channel MOS transistor;

first and second contact plugs formed in said interlayer insulation film in correspondence to said source region and drain region of n-type;

third and fourth contact plugs formed in said interlayer insulation film in correspondence to said source region and drain region of p-type, a first tip end part of said first contact plug causing a first tensile stress within said source region of n-type, a second tip end part of said second plug causing a second tensile stress within said drain region of n-type, a third tip end part of said third contact plug causing a third compressive stress within said source region of p-type,
a fourth tip end part of said fourth contact plug causing a fourth compressive stress within said drain region of p-type.

13. The p-channel MOS transistor as claimed in claim 1, wherein said p-type source region and said p-type drain region have respective bottoms thereof located at a level lower than a bottom of said metal and/or metal compound film.

* * * * *